(12) United States Patent
Hakko

(10) Patent No.: US 9,035,230 B2
(45) Date of Patent: May 19, 2015

(54) OPTICAL ELEMENT AND IMAGE SENSOR

(75) Inventor: Manabu Hakko, Utsunomiya (JP)

(73) Assignee: CANON KABUSHIKI KAISHA (JP)

( * ) Notice: Subject to any disclaimer, the term of this patent is extended or adjusted under 35 U.S.C. 154(b) by 415 days.

(21) Appl. No.: 13/434,966

(22) Filed: Mar. 30, 2012

(65) Prior Publication Data
US 2012/0248561 A1 Oct. 4, 2012

(30) Foreign Application Priority Data
Apr. 1, 2011 (JP) ................................. 2011-081367

(51) Int. Cl.
- H01J 40/14 (2006.01)
- G02B 3/00 (2006.01)
- H01L 27/146 (2006.01)
- H01L 31/0216 (2014.01)

(52) U.S. Cl.
CPC ............ *G02B 3/0043* (2013.01); *G02B 3/0056* (2013.01); *H01L 27/14629* (2013.01); *H01L 31/02161* (2013.01)

(58) Field of Classification Search
CPC .................. H01L 27/14601; H01L 27/14625; H01L 31/0232; G02B 1/002; G02B 5/18; G02B 5/18009; G02B 5/1823; G02B 26/0808
USPC ........... 250/216, 208.1, 214.1, 237 R, 237 G; 362/326, 331; 313/506
See application file for complete search history.

(56) References Cited

U.S. PATENT DOCUMENTS

2006/0024011 A1\* 2/2006 Enokido ....................... 385/129
2006/0175962 A1 8/2006 Fujimoto et al.

FOREIGN PATENT DOCUMENTS

| JP | 09-105927 A | 4/1997 |
| JP | 2005-079674 A | 3/2005 |
| JP | 2005-142429 A | 6/2005 |
| JP | 2006-221976 A | 8/2006 |
| JP | 2007328096 A | 12/2007 |

OTHER PUBLICATIONS

Japanese Office Action cited in Japanese counterpart application No. JP2011-081367, dated Jan. 20, 2015.

\* cited by examiner

*Primary Examiner* — Kevin Pyo
(74) *Attorney, Agent, or Firm* — Rossi, Kimms & McDowell LLP

(57) ABSTRACT

An optical element includes a refractive index pattern that is periodically formed by a plurality of media having refractive indices different from each other. The highest diffraction order for a light beam of a first wavelength region that enters the optical element is greater than the highest diffraction order for a light beam of a second wavelength region that is longer than the first wavelength region, and the light beams of the first wavelength region and the second wavelength region are emitted so that each of the light beams of the first wavelength region and the second wavelength region is periodically localized.

9 Claims, 6 Drawing Sheets

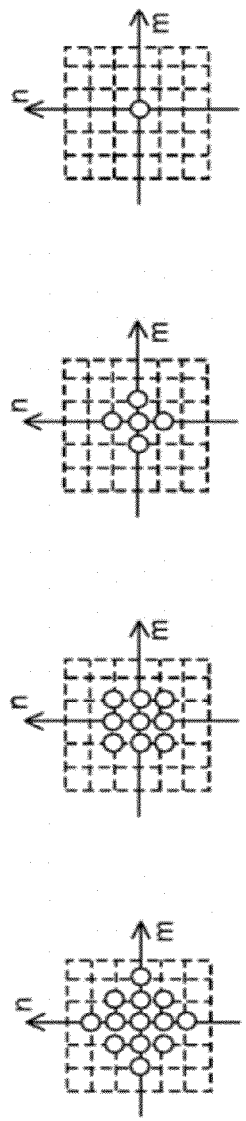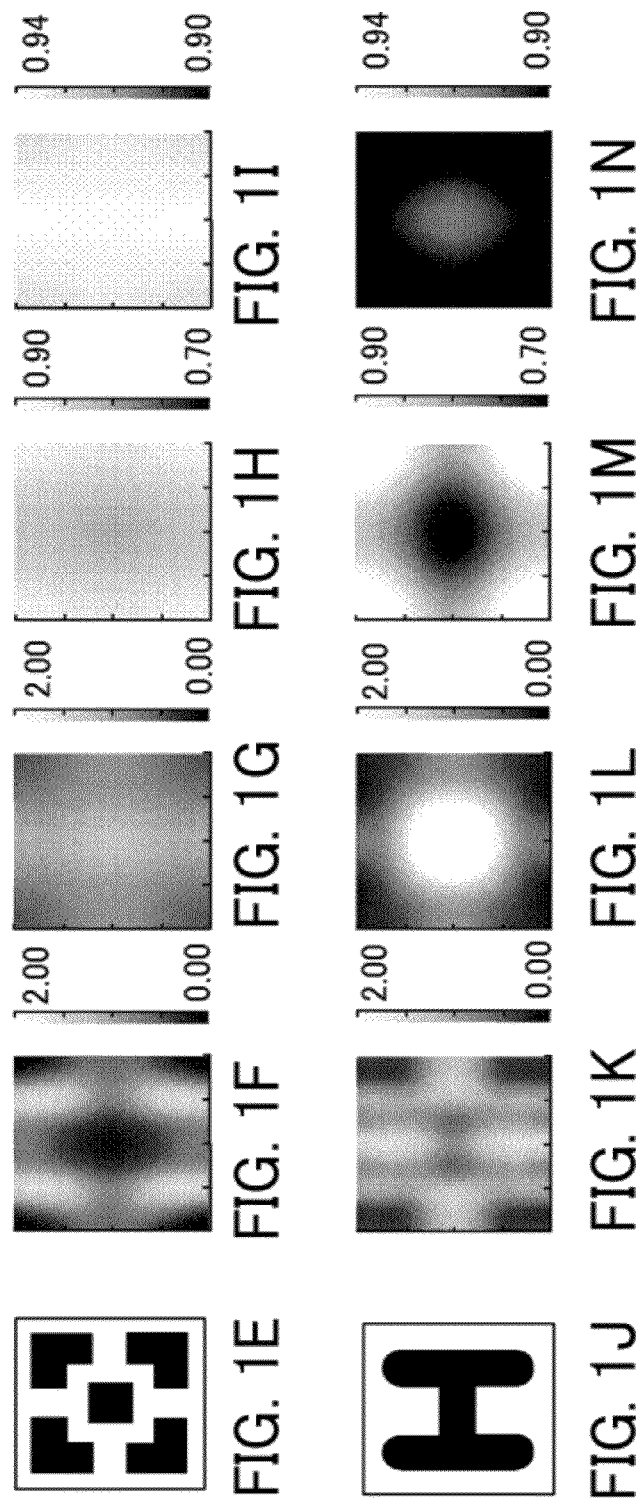

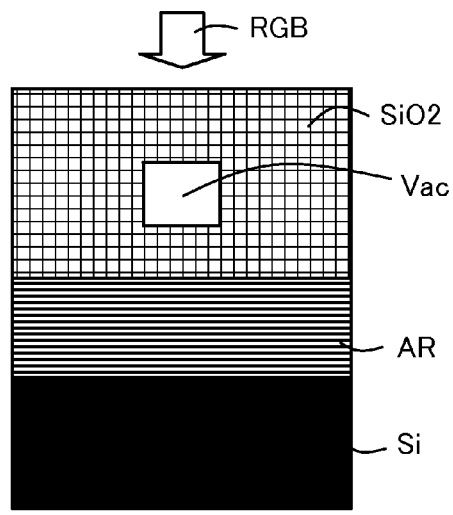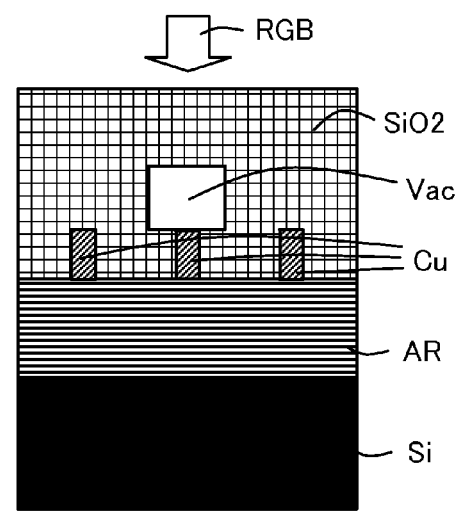
FIG. 7A  FIG. 7B
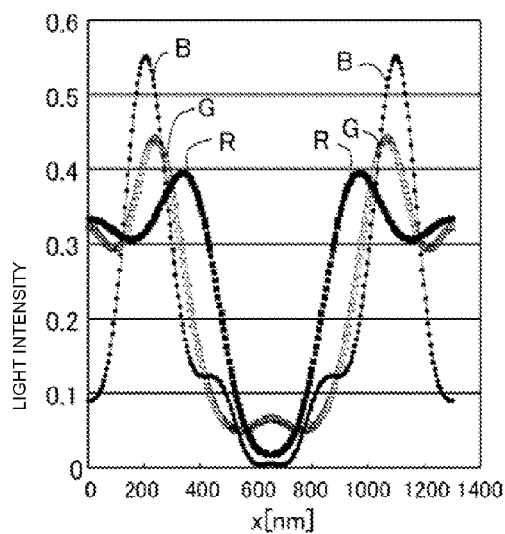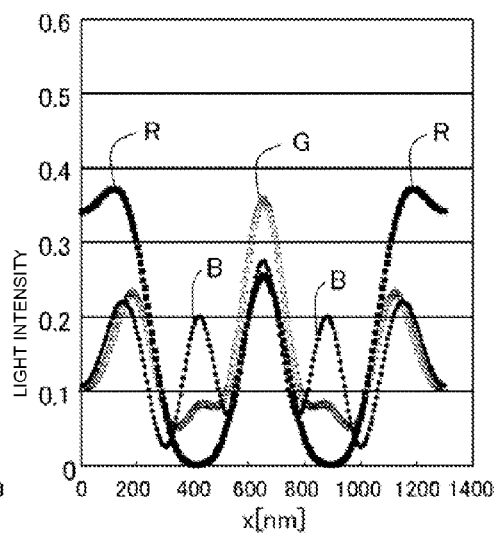
FIG. 7C  FIG. 7D

OPTICAL ELEMENT AND IMAGE SENSOR

BACKGROUND OF THE INVENTION

1. Field of the Invention

The present invention relates to an optical element in which a refractive index pattern that is formed by a plurality of media having refractive indices different from each other is periodically formed.

2. Description of the Related Art

Recently, high functionality of a solid-state image sensor is desired, and therefore an element using a photonic crystal that obtains a sufficient function even when the size of a pixel is around the same as a wavelength of a sensing electromagnetic wave is proposed. The photonic crystal is a structure that has a periodically-varying refractive index. Commonly, the period of the structure of the photonic crystal is around the same as the wavelength of the mutually-interacting electromagnetic wave. In addition, the structure of the photonic crystal is commonly designed so as to be optimized for each wavelength of the electromagnetic wave and have a selective effect for a specific wavelength.

Japanese Patent Laid-Open No. 2005-142429 discloses a configuration in which red, green, and blue photonic crystals are used for red, green, and blue wavelengths respectively and an electromagnetic wave (light) vertically enters a microlens for each of the red, green, and blue wavelengths. Japanese Patent Laid-Open No. 2005-79674 discloses a technology in which a photonic crystal is used to emit red, green, and blue lights at different angles to sense the light using solid-state image sensors having three different substrates for the red, green, and blue lights. This technology relates to a solid-state image pickup apparatus of a three-substrate type, and controls propagation directions of the red, green, and blue lights. Japanese Patent Laid-Open No. 2006-221976 discloses a diffraction grating that functions for all of the red, green, and blue wavelengths and that has a structure smaller than a wavelength. In the technology disclosed in Japanese Patent Laid-Open No. 2006-221976, diffraction efficiencies of the red and blue lights are controlled by using the same diffraction grating. Japanese Patent Laid-Open No. H09-105927 discloses a liquid crystal device that suppresses the deterioration of light use efficiency that is generated by a color filter used in performing the color separation of white light that is visible light into red, green, and blue lights using a diffraction grating.

However, in the configuration disclosed in Japanese Patent Laid-Open No. 2005-142429, the light use efficiency is deteriorated by cutting the light having other wavelengths using the color filter in sensing the lights having the red, green, and blue wavelengths. In addition, a phenomenon called a false color in which an image is taken by a color different from an original object color is generated.

Japanese Patent Laid-Open No. 2005-79674 cannot sense the red, green, and blue lights at a fine period since the propagation directions of the red, green, and blue lights are controlled to be sensed by the three-substrate solid-state image sensor.

In Japanese Patent Laid-Open No. 2006-221976, an area ratio of two kinds of diffraction gratings that correspond to the red and blue lights is adjusted to control the diffraction efficiencies of the red and blue lights, but the number of variables that can be independently adjusted is small when using only the area ratio of the diffraction gratings and therefore it is difficult to maximize the diffraction efficiency. Furthermore, it does not disclose a method of independently controlling the diffraction efficiency of the green light. In Japanese Patent Laid-Open No. 2006-221976, the shape of the structure is not adjusted although the grating period is adjusted, and therefore the light intensity distribution for each wavelength cannot be controlled with higher precision.

In Japanese Patent Laid-Open No. H09-105927, the propagation direction of each of the red, green, and blue lights is controlled, but a relative value of the diffraction efficiencies of a plurality of diffraction orders is not controlled. Therefore, each light intensity distribution cannot be precisely controlled.

SUMMARY OF THE INVENTION

The present invention provides an optical element and an image sensor that have different functions for each wavelength with a common structure for a plurality of wavelengths.

An optical element as one aspect of the present invention includes a refractive index pattern that is periodically formed by a plurality of media having refractive indices different from each other. The highest diffraction order for a light beam of a first wavelength region that enters the optical element is greater than the highest diffraction order for a light beam of a second wavelength region that is longer than the first wavelength region, and the light beams of the first wavelength region and the second wavelength region are emitted so that each of the light beams of the first wavelength region and the second wavelength region is periodically localized.

An image sensor as another aspect of the present invention includes the optical element an a light receiving element that has light receiving regions that the light beams of the first wavelength region and the second wavelength region enter are periodically disposed.

Further features and aspects of the present invention will become apparent from the following description of exemplary embodiments with reference to the attached drawings.

BRIEF DESCRIPTION OF THE DRAWINGS

FIGS. 1A to 1N are diagrams of describing cases in which the highest diffraction order and a refractive index pattern (a structure smaller than a wavelength) are controlled for an optical element in the present embodiment.

FIGS. 4A to 4P are diagrams of illustrating light intensity distributions of wavelength of blue, green, and red colors in the optical element in Embodiment 1.

FIGS. 7A to 7D are diagrams of illustrating light intensity distributions of red, green, and blue wavelengths in an optical element in Embodiment 4.

DESCRIPTION OF THE PREFERRED EMBODIMENTS

Figure 2:
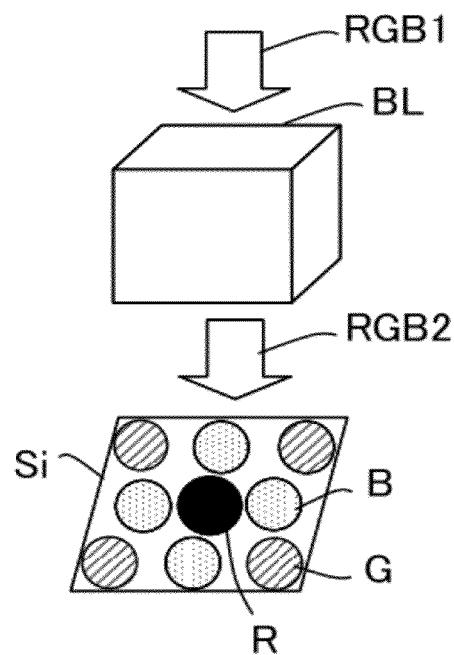
FIG. 2 is a schematic diagram of an optical element (an image sensor) that performs sensing of light of red, green, and blue colors in the present embodiment.

Exemplary embodiments of the present invention will be described below with reference to the accompanied drawings.

In each of the drawings, the same elements will be denoted by the same reference numerals and the duplicate descriptions thereof will be omitted.

The present embodiment provides an optical element that has a common structure for a plurality of wavelengths and that has different functions for each wavelength, and an image sensor that uses the optical element. Commonly, a conventional photonic crystal that optimizes the structure for each use wavelength has a different structure for each wavelength. For example, when the photonic crystal has a structure in which a void having a cylindrical shape is periodically arrayed on a glass substrate, an interval, a diameter, or a depth (a thickness) of the void is optimized in accordance with each wavelength.

On the other hand, the optical element in the present embodiment has a common structure for all wavelengths that are to be controlled. In the embodiment, all the wavelengths that are to be controlled are a plurality of wavelengths between the minimum wavelength $\lambda 1$ and the maximum wavelength $\lambda 2$ (a first wavelength region, and a second wavelength region). The structure of the optical element that functions for the wavelength region, for example as illustrated in FIG. 4D, has a unit structure containing a void having a cylindrical shape or a rectangular parallelepiped on a glass substrate and that has a periodic structure in which this unit structure is periodically arrayed in both directions of two dimensions. For example, a case in which the optical element is applied as a transmissive element for light beams in a visible range, i.e. light beams of red, green, and blue colors, is considered. The wavelength of the blue light beam is $\lambda 1$, and the wavelength of the red light beam is $\lambda 2$. The plurality of wavelengths are three wavelengths of the red, green, and blue colors. The optical element transmits all the red, green, and blue light beams, and controls light intensity distributions of the red, green, and blue light beams at an arbitrary propagation distance. The light intensity distributions for the red, green, and blue colors have periods (intensity periods) that correspond to the period of the optical element. The optical element has a function of collecting (localizing) the red, green, and blue light beams at different positions respectively in a unit period of the intensity period. The optical element can also collect (localize) the red, green, and blue light beams at the same position in the unit period of the intensity period. Furthermore, the optical element can control the light intensity distributions for the red, green, and blue light beams to be changed to various distributions.

In the present embodiment, the highest diffraction order for the light beam entering the optical element in the first wavelength region is greater than the highest diffraction order for the light beam in the second wavelength region longer than the first wavelength region. Hereinafter, "the highest diffraction order" will be defined. The three-wavelength lights of the red, green, and blue colors that have entered the optical element generate diffracted lights that correspond to respective wavelengths. In this case, when the diffraction order of the diffracted light is denoted by (dm, dn) where dm is the diffraction order in an x direction and dn is the diffraction order in a y direction, the highest order of the diffracted lights that are to be generated is generally different in accordance with the three wavelengths of the red, green, and blue colors. In this case, the highest order is the maximum value of $dm^2+dn^2$, which is represented as the highest diffraction order. The highest diffraction order of the wavelength $\lambda 1$ (the first wavelength region) is represented as (m1, n1) where m1 is the highest diffraction order in the x direction and n1 is the highest diffraction order in the y direction. Similarly, the highest diffraction order of the wavelength $\lambda 2$ (the second wavelength region) is represented as (m2, n2). The values of m1 and n1 are uniquely determined based on the wavelength $\lambda 1$ and periods Lx and Ly of the optical element. Similarly, the values of m2 and n2 are uniquely determined based on the wavelength $\lambda 2$ and the periods Lx and Ly of the optical element. The wavelengths $\lambda 1$ and $\lambda 2$ have a relation of $\lambda 1 < \lambda 2$.

The function of the optical element that controls the light intensity distributions of the red, green, and blue light beams can be achieved by two configuration requirements of the optical element described below.

A first configuration requirement is that the period of the optical element meets $m1^2+n1^2>m2^2+n2^2$. For example, when the period Lx in the x direction and the period Ly in the y direction of the optical element are equal to each other and therefore L=Lx=Ly is met, $m1^2+n1^2$ needs to be equal to 1 at least. Therefore, in order to meet the first configuration requirement, the period L needs to be greater than the wavelength $\lambda 1$ so that the diffracted light having the wavelength $\lambda 1$ emits. In this case, for example, when the wavelength $\lambda 2$ is greater than the period L of the optical element, m2=0 and n2=0 are met and therefore $m1^2+n1^2>m2^2+n2^2$ is met. In addition, when $L \geq 3 \times \lambda 1$ and $L < 4 \times \lambda 1$ are met, m1=1 and n1=0 are met. Also, when the highest diffraction order (m2, n2) is equal to (2, 2), $m1^2+n1^2>m2^2+n2^2$ is met. Alternatively, when the highest diffraction order (m2, n2) meets any one of (2, 1), (1, 2), (1, 1), (1, 0), (0, 1), and (0, 0), $m1^2+n1^2>m2^2+n2^2$ is met. Thus, the period L of the optical element is set so that the highest diffraction order of the diffracted light that is generated by the optical element is different between the wavelengths $\lambda 1$ and $\lambda 2$.

Subsequently, an expression that uniquely determines the value of $m1^2+n1^2$ (or $m2^2+n2^2$) of the highest diffraction order (m1, n1) (or (m2, n2)) based on the periods Lx and Ly of the optical element and the wavelength $\lambda 1$ (or the wavelength $\lambda 2$) will be described. In the embodiment, $\delta 1$ that meets $\delta 1 < (2\pi/Lx)$ and $\delta 1 < (2\pi/Ly)$, and $\delta 2$ that meets $\delta 2 < (2\pi/Lx)$ and $\delta 2 < (2\pi/Ly)$ are defined. In this case, the integer $m1^2+n1^2$ is uniquely determined for the integers m1 and n1 so that the following Expression (1) is met.

$$(2\pi/\lambda 1) = \sqrt{[m1^2 \times (2\pi/Lx)^2 + n1^2 \times (2\pi/Ly)^2] + \delta 1^2} \quad (1)$$

Similarly, the integer $m2^2+n2^2$ is uniquely determined for the integers m2 and n2 so that the following Expression (2) is met.

$$(2\pi/\lambda 2) = \sqrt{[m2^2 \times (2\pi/Lx)^2 + n2^2 \times (2\pi/Ly)^2] + \delta 2^2} \quad (2)$$

In Expressions (1) and (2), sqrt[ ] means a root.

Meeting the expression of $m1^2+n1^2>m2^2+n2^2$ that is the first configuration requirement means that a diffraction order that is generated at the wavelength $\lambda 1$ and that is not generated at the wavelength $\lambda 2$ exists. Therefore, each of the light intensity distributions of the light beams having the wavelengths $\lambda 1$ and $\lambda 2$ can be controlled by setting the highest diffraction order for the light beam having the wavelength $\lambda 1$ (the first wavelength region) that enters the optical element to be greater than the highest diffraction order for the light beam having the wavelength $\lambda 2$ (the second wavelength region). For example, the diffracted lights having the wavelengths $\lambda 1$ and $\lambda 2$ that transmit through the optical element can be collected (localized) at positions different from each other in the unit period of the intensity period. In addition, the light beams having the wavelengths $\lambda 1$ and $\lambda 2$ can also be collected (localized) at the same position. However, it is difficult to precisely control the light intensity distributions of these light beams only by differentiating the highest diffraction orders between the wavelengths $\lambda 1$ and $\lambda 2$. It is because controlling a relative value of diffraction efficiencies in the plurality of diffraction orders in addition to the highest diffraction order is required in order to precisely control the light intensity distribution. Accordingly, as a second configuration requirement, a condition that controls the relative value of the diffraction efficiencies in the plurality of diffraction orders is needed.

The second configuration requirement is that the optical element has a structure (a refractive index pattern) smaller than the wavelength in the unit period. The light intensity distribution can be controlled by adjusting a refractive index, a shape, and a size of the structure smaller than the wavelength. The structure smaller than the wavelength may also be a plurality of shapes that are non-similar shapes each other. The degree of freedom increases by not limiting the shape, and therefore it is possible to control the light intensity distribution with higher accuracy. Commonly, the structure that is smaller than the wavelength is used to control non-propagating light. However, the diffraction efficiency of the diffracted light that is propagating light can also be controlled by the structure smaller than the wavelength. Accordingly, the light intensity distribution at a distance where the influence of the non-propagating light disappears can be controlled by adjusting the structure smaller than the wavelength. The optical element of the present embodiment positively controls the diffraction efficiency by adjusting the structure smaller than the wavelength.

In Japanese Patent Laid-Open No. 2006-221976, the diffraction efficiency is controlled by the periods that correspond to the wavelengths of the red and blue colors. In this method, the diffraction efficiency is controlled in accordance with a shape of the structure smaller than the wavelength. According to the configuration, higher light use efficiency can be obtained. Furthermore, in this method, the light intensity can be controlled also for a plurality of wavelengths other than the two wavelengths of the red and blue colors. Details of this will be described in Embodiment 1. In Embodiment 2, an effect where the structure smaller than the wavelength changes the diffraction efficiency will be described. The structure that is smaller than the wavelength (the refractive index pattern) contained in the unit grating of the optical element may also be a plurality of shapes that are similar to each other. The embodiment is not limited to a case in which the plurality of structures smaller than the wavelength are contained in the unit grating, and only one structure smaller than the wavelength may also be contained in the unit grating. In this case, a larger amount of degree of freedom can be obtained if it is a complicated structure rather than the structure that is determined only by a radius such as a circular shape. The wavelength in considering the structure smaller than the wavelength may also be a wavelength region that has a wavelength width. This wavelength width is a value in a range of having the common highest diffraction order. In the present embodiment, the structure smaller than the wavelength (the refractive index pattern) is defined as a structure that is smaller than a representative value (for example, the maximum wavelength or a center wavelength of the wavelength region) of the wavelength region (for example, the second wavelength region (the wavelength $\lambda 2$)).

As described above, the optical element of the present embodiment has the period L that meets $m1^2+n1^2>m2^2+n2^2$ for the highest order (m1, n1) of the diffracted light having the wavelength $\lambda 1$ and the highest order (m2, n2) of the diffracted light having the wavelength $\lambda 2$, and has the structure that is smaller than the wavelength $\lambda 2$ in the unit period.

Subsequently, referring to FIGS. 1A to 1N, the optical element of the present embodiment will be described. FIGS. 1A to 1N are diagrams of describing a case in which the highest diffraction order and the refractive index pattern (the structure smaller than the wavelength) are controlled.

Both FIGS. 1E and 1J illustrate the unit period (xy plane) of the optical element. The unit period meets Lx=Ly=L=540 nm. The optical element is formed by providing a void in a glass, and black portions in FIGS. 1E and 1J indicate the void (air) and white portions illustrate the glass. A thickness in a z direction (a direction perpendicular to the paper plane) is 300 nm. The optical element of the present embodiment is configured by being held by two glass substrates each having a thickness of 100 nm between the structures. Electromagnetic waves of four wavelengths enter the optical element having a total thickness of 500 nm in a perpendicular direction (the z direction). A polarization of the electromagnetic wave is in the y direction (a vertical direction in FIGS. 1A to 1N). The light intensity distribution of the transmitting light in this case will be described. In FIGS. 1A to 1N, the unit period of the intensity period that is formed by the light beam propagating the air on a plane at a distance of 1 μm from the optical element is illustrated. The propagation distance of 1 μm is a distance greater than a distance where the near-field effect such as surface plasmon effects is seen. In the present embodiment, the four wavelengths of the electromagnetic waves entering the optical element are 250 nm, 300 nm, 530 nm, and 660 nm, respectively. The unit period L (=540 nm) is set so that the highest order of the diffracted light is different between the wavelength $\lambda 1$ (=250 nm) that is the minimum wavelength and the wavelength $\lambda 2$ (=660 nm) that is the maximum wavelength of these wavelengths. In the present embodiment, the highest order is different for all the wavelengths including the minimum wavelength and the maximum wavelength.

FIGS. 1A to 1D illustrate the diffracted lights for the electromagnetic waves of the four wavelengths. The diffracted lights in FIGS. 1A to 1D are diffracted lights for the electromagnetic waves having the wavelengths of 250 nm, 300 nm, 530 nm, and 660 nm, respectively. They are different with respect to the highest diffraction orders (m, n) of FIGS. 1A to 1D that are equal to (2, 0) or (0, 2), (1, 1), (1, 0) or (0, 1), and (0, 0), respectively. In accordance with to the difference of the highest diffraction order, the light intensity distributions are changed as illustrated in FIGS. 1F to 1I for the structure of FIG. 1E. Similarly, the light intensity distributions are changed as illustrated in FIGS. 1K to 1N for the structure of FIG. 1J. Thus, the optical element of the present embodiment can form the light intensity distributions different from each other with respect to the light beam having each wavelength.

Also for the electromagnetic wave having the same wavelength, the optical element having the structure of FIG. 1E and the optical element having the structure of FIG. 1J form the light intensity distributions different from each other. Since both the optical elements of FIGS. 1E and 1J have the unit period L=540 nm, this difference is caused by the structure smaller than the wavelength (the refractive index pattern). The diffraction efficiency is controlled for each wavelength by variously changing the shape of the structure smaller than the wavelength, and therefore the light intensity distribution can be controlled. The optical element of FIG. 1E contains a plurality of refractive index patterns in the unit period of the refractive index pattern, and the plurality of refractive index patterns are configured by patterns having a different size or a non-similar shape. The light intensity distribution can be controlled by changing the shape, the size, or the position relation of each pattern. The optical element of FIG. 1J is provided with an H-shaped void structure without including a plurality of structures. The H-shaped void structure has a lot of shape variables such as a vertical length, a horizontal length, or a width of the void, compared to a circular structure, and the light intensity distribution can be controlled by changing these shape variables. Thus, the light intensity distribution can be precisely controlled at an arbitrary propagation distance by adjusting the period so that the highest order of the diffracted light is different with respect to the use wavelength and also by changing the structure smaller than the wavelength (the refractive index pattern).

The technology disclosed in Japanese Patent Laid-Open No. 2006-221976 controls the diffraction efficiency of the red and blue light, and on the other hand indirectly controls the green light with respect to the lights having the red, green, and blue wavelengths. One of the reasons that it is difficult to control independently the green light is as follows. The structure disclosed in Japanese Patent Laid-Open No. 2006-221976 is a structure having a period of 650 nm. On the other hand, the red wavelength is 650 nm and the blue wavelength is 450 nm. On the basis of these conditions, the highest diffraction order of the red light is (1, 0) or (0, 1). The highest diffraction order of the blue light is (1, 1). The highest diffraction order of the green wavelength having a wavelength from 450 nm to 650 nm is equal to any one of the highest diffraction order of the red wavelength or the highest diffraction order of the blue wavelength. Therefore, there is no distribution of the diffraction order that is obtained only by the light having the green wavelength, and it is difficult to independently control the green. On the other hand, in the present embodiment, a solid-state image sensor is used as an example, and the period is set so that the highest diffraction orders of the red, green, and blue wavelengths are different from each other. In the configuration, the diffraction efficiency of the green light can also be controlled independently. This will be described in Embodiment 1.

Subsequently, an image sensor (a solid-state image sensor) that includes the optical element will be described. In the present embodiment, specifically, the solid-state image sensor having the optical element that is used for sensing the lights of the red (660 nm), green (550 nm), and blue (440 nm) wavelengths will be described. The solid-state image sensor is a common element that is configured by silicon and that performs a photoelectric conversion of the lights having the red, green, and blue wavelengths to be sensed. The red, green, and blue lights can be sensed at different positions of the silicon by collecting (localizing) the red, green, and blue lights on the different positions of the silicon using the optical element.

FIG. 2 is a schematic diagram of the optical element (the image sensor) that senses the red, green, and blue lights. Reference symbol RGB1 denotes incident light, which is white light containing the red, green, and blue light beams. Reference symbol BL denotes a structure that corresponds to the unit period of the optical element. Reference symbol RGB2 denotes transmitted light that is emitted from the structure BL. Reference symbol Si denotes a unit period of an intensity period (hereinafter, referred to as a "unit intensity period") on a surface where the light intensity distributions of the blue, green, and red light beams (hereinafter, referred to as a "sensing surface"). Reference symbol R (a black portion) denotes a region where the light intensity of the red wavelength is high, reference symbol G (a shaded portion) is a region where the light intensity of the green wavelength is high, and Reference symbol B (a dotted portion) is a region where the light intensity of blue wavelengths is high. This is a region that corresponds to the unit period, which is periodically arrayed. Thus, the optical element having the periodic structure BL emits each light beam so that the light beam having each wavelength is periodically localized. The image sensor having this optical element senses the red, green, and blue lights at positions where the light intensity of each wavelength is high with respect to the different light intensity distributions for the red, green, and blue color. As a result, in principle, a color separation can be performed without using a color filter by sensing the different light intensity distributions for the red, green, and blue colors at the positions where the density of the light intensity distribution is high.

When an ideal distribution where the light intensity distributions of the red, green, and blue lights in the unit intensity period are not overlapped with each other is obtained and an ideal condition where a transmittance of the structure BL is 100% is obtained, all of the red, green, and blue wavelengths can be sensed with an efficiency of 100%. This is a high light use efficiency compared to a case in which the transmittances for the red, green, and blue wavelengths are 25%, 50%, and 25% respectively on conditions that the sensing is performed for the structure having a transmittance of 100% and having the Bayer array. A light-blocking aluminum layer that is disposed in the image sensor can be simplified or omitted by collecting (localizing) the light intensity distributions at different positions with respect to each wavelength. Furthermore, since all the red, green, and blue wavelengths can be sensed in the unit intensity period of the optical element, the generation of the false color is suppressed. The period of the optical element corresponds to a spatial resolution (a pixel pitch of an image) in taking the image of an object. This is around the same to twice as long as the wavelength, which corresponds to the fact that the sensing can be performed with the resolution of this size. Therefore, a higher-resolution can be achieved compared to the case of the solid-state image sensor having a macroscopic structure having a size larger than the wavelength. In addition, the sensing can be performed at a position where the light intensity for each wavelength is high by emitting each light beam so that each light beam of the red, green, and blue light beams are localized at periodically-different positions. Therefore, the sensing of low-intensity light can also be performed and the high sensitivity can be achieved. The details will be described in Embodiment 2.

Furthermore, all the red, green blue light beams can also be localized at the same position in the unit intensity period. For example, when a position that avoids a wiring space is the same position even if the red, green, and blue wavelengths are different, surface densities of the red, green, and blue light intensities can be increased at the position that avoids the wiring space. The details will be described in Embodiment 3. In this case, it is preferred that the color separation of the red, green, and blue colors be performed using the color filter. The color separation of the light intensity distribution using the optical element may also be performed by the color filter. The depth of the sensing surface may be the same or different with respect to each wavelength of the red, green, and blue colors. The wavelength region of the light beams that is applicable to the optical element (the image sensor) in the present embodiment is not limited to a visible light region, and alternatively a region such as an ultraviolet, infrared, or terahertz wavelength may also be applied. The optical element of the present embodiment effectively functions also for the electromagnetic wave other than the visible light.

Hereinafter, in each embodiment, a specific structure of the optical element (the image sensor) will be described.

Embodiment 1

First of all, in Embodiment 1, an optical element that controls light intensity distributions of red (660 nm), green (550 nm), and blue (440 nm) wavelengths will be described. A case in which white light containing the red, green, and blue wavelengths vertically enters the optical element is considered. The white light is non-polarized light (x polarized light+y polarized light).

Figure 3A:
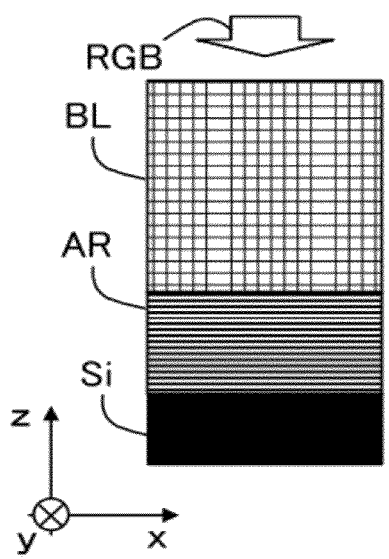
FIGS. 3A and 3B are schematic diagrams of an optical element in Embodiment 1.
Figure 3B:
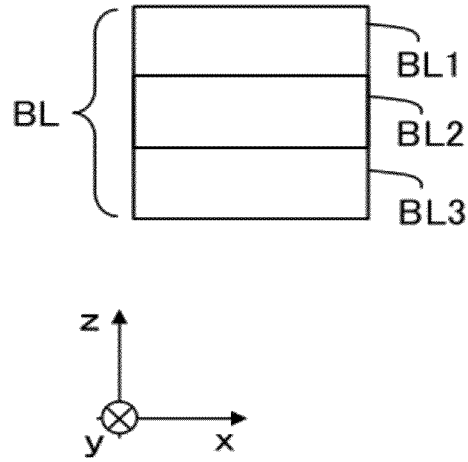

FIGS. 3A and 3B are schematic diagrams of the optical element in the present embodiment. FIG. 3A is a cross-sectional diagram of the optical element, and the area indicated by the structure BL illustrates a unit period structure of the optical element. The white light RGB enters the structure BL vertically (in a z direction). An antireflection film AR is provided under the structure BL. The antireflection film AR has a multilayer film structure containing eleven layers. Total of the thickness of the eleven layers of the antireflection film AR is 550 nm. However, the number of the layers, the material, the thickness of the antireflection film AR, or the like can be appropriately modified. The silicon Si is provided under the antireflection film AR. In the present embodiment, the light intensity distribution that is to be controlled is a distribution on an upper surface of the silicon Si.

FIG. 3B is a structural diagram of the structure BL that constitutes the optical element. As illustrated in FIG. 3B, the optical element has a three-layer structure, which contains a structure BL1 as a first layer configured by a glass having a thickness of 400 nm, a structure BL2 as a second layer configured by a glass having a thickness of 400 nm, provided with voids, and a structure BL3 as a third layer configured by a glass having a thickness of 400 nm. In the present embodiment, the structure provided with the voids (the refractive index pattern) is only the structure BL2 of the second layer. Since the structures BL1 of the first layer and the structure BL3 of the third layer do not contain the refractive index pattern, the shifts in the x and y directions with respect to the second layer can be ignored. Therefore, the alignment of each layer in forming the optical element is easily performed. The structure BL2 of the second layer has a periodic structure of the unit period of Lx=Ly=L=1300 nm.

FIGS. 4A to 4P are diagrams of illustrating light intensity distributions of the blue, green, and red wavelengths in the present embodiment. In the present embodiment, two patterns of the structure of the unit grating are considered and the two pattern of the structure are illustrated in FIGS. 4D and 4K. In FIGS. 4D and 4K, a white portion denotes a glass, and a black portion denotes a void (air). Both the structures of the two patterns have a period of 1300 nm and a thickness of 400 nm. Furthermore, both the structures are held by glasses having a thickness of 400 nm on both sides. The antireflection film AR and the silicon Si are commonly used. The details of the patterns of FIGS. 4D and 4K are illustrated in FIGS. 4O and 4P, respectively.

FIGS. 4A to 4C are diffracted light distributions of the diffracted lights when the blue, green, and red lights enter the structure of FIG. 4D. The diffracted light distributions are obtained on condition that the refractive index of the void is 1. A white circle indicates diffracted light that has high diffraction efficiency and that has large contribution to the light intensity distribution. A black circle indicates diffracted light that has low diffraction efficiency and that has small contribution to the light intensity distribution. The highest diffraction orders for the blue, green, and red light beams are different from each other, and the light intensity distributions of the blue, green, and red light beams can be independently controlled. Also for the refractive index of the glass, the highest diffraction orders of the blue, green, red light beams are different from each other. FIGS. 4H to 4J are diffracted light distributions of the diffracted lights when the blue, green, red lights enter the structure of FIG. 4K. Since the period L of the structure is equal to each other, the highest diffraction orders of the blue, green, and red lights are equal to those of the structure of FIG. 4D. However, the diffraction efficiency of each diffraction order is different from that of the structure of FIG. 4D since the arrangements of the white circle and the black circle are different from each other. Therefore, the diffraction efficiency can be adjusted by adjusting the structure smaller than the wavelength (the refractive index pattern).

Subsequently, the light intensity distribution will be described. FIGS. 4E to 4G illustrate unit periods of the light intensity distributions of the blue, green, red light respectively for the structure of FIG. 4D. The light intensity is collected (localized) at different positions in the unit period of the light intensity distribution for each of the blue, green, red wavelengths. FIGS. 4L to 4N illustrate unit periods of the light intensity distributions of the blue, green, and red lights respectively for the structure of FIG. 4K. For all the blue, green, and red wavelengths, the intensity is collected (localized) in a center portion in the unit period of the light intensity distribution. The difference between the light intensity distributions that are formed by the structures of FIGS. 4D and 4K is generated by the difference of the void structure smaller than the wavelength (the difference of the refractive index patterns) since the period of the structure is 1300 nm which is same each other. The diffraction efficiency is adjusted by the void structure that is smaller than the wavelength to obtain the different light intensity distributions between the structures of FIGS. 4D and 4K. The light intensity distributions of the blue, green, and red lights can be collected at positions different from each other as described in the present embodiment, and alternatively the light intensity distributions can also be collected at the same position. The optical element that has the unit structure of FIG. 4D or 4K functions as an optical element that controls the light intensity distribution.

Thus, the optical element of the present embodiment can control a relative value of the diffraction efficiencies of a plurality of diffraction orders and can also control the light intensity distribution for each wavelength by controlling a shape of the structure smaller than the wavelength. The light intensity distribution can be controlled by changing the shape of the structure smaller than the wavelength, and also the light intensity distribution can be controlled with higher precision.

Embodiment 2

Next, in Embodiment 2, a case in which an optical element that controls light intensity distributions of red (660 nm), green (550 nm), and blue (440 nm) wavelengths is applied to an image sensor (a solid-state image sensor) will be described. The image sensor of the present embodiment is the solid-state image sensor that includes the optical element that senses the each of lights having the red, green, and blue wavelengths, which is a common element that performs a photoelectric conversion and sensing of each of the lights having the red, green, and blue wavelengths using silicon. Specifically, the image sensor includes the optical element and a light receiving element in which light receiving regions, i.e. three light receiving regions of red, green, and blue lights, which light beams of a first wavelength region (a wavelength λ1) and a second wavelength region (a wavelength λ2) emitted from the optical element enter are periodically arranged.

The image sensor includes the structure that is illustrated in FIG. 3A described in Embodiment 1. The lights having the red, green, and blue wavelengths transmit through the structure BL of the optical element and the antireflection film AR having the same configuration as Embodiment 1, and then the lights are sensed on an upper surface of the silicon Si that is a sensing surface. As the structure BL of the optical element in the present embodiment, a structure in which the structure BL2 of FIG. 3B has the structure of FIG. 4D is used. The structure of FIG. 4D collects (localizes) the blue, green, and red light beams at positions different from each other. Using this function, the image sensor can sense the blue, green, and red lights at the positions of the silicon Si that are different from each other. The period of 1300 nm of the structure corresponds to a spatial resolution in taking an image of an object (a pixel pitch of the image).

Figures 5A, 5B, 5C:
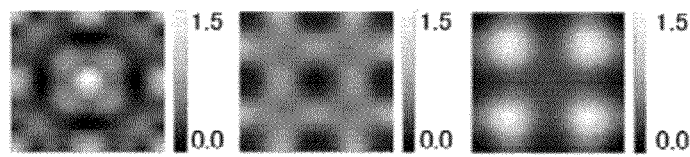
FIGS. 5A to 5P are diagrams of illustrating light intensity distributions of wavelength of red, green, and blue colors in an image sensor in Embodiment 2.
Figures 5D, 5E, 5F, 5G:
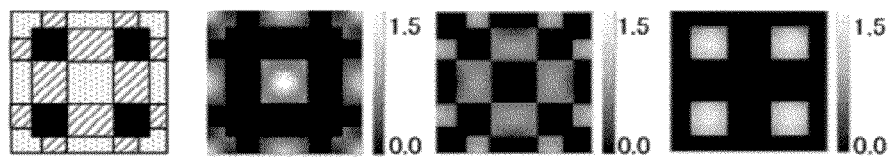
Figures 5H, 5I, 5J:
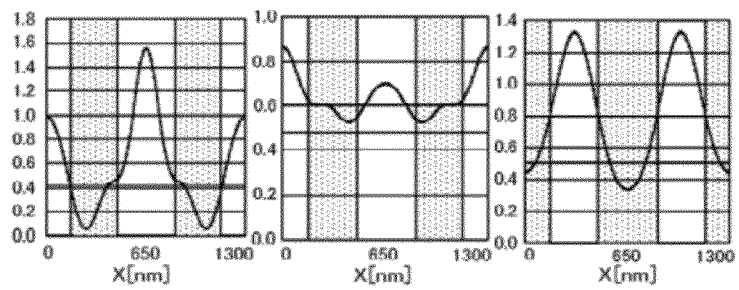
Figures 5K, 5L, 5M:
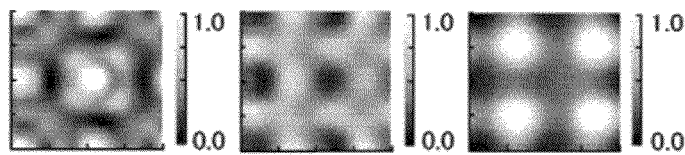
Figures 5N, 5O, 5P:
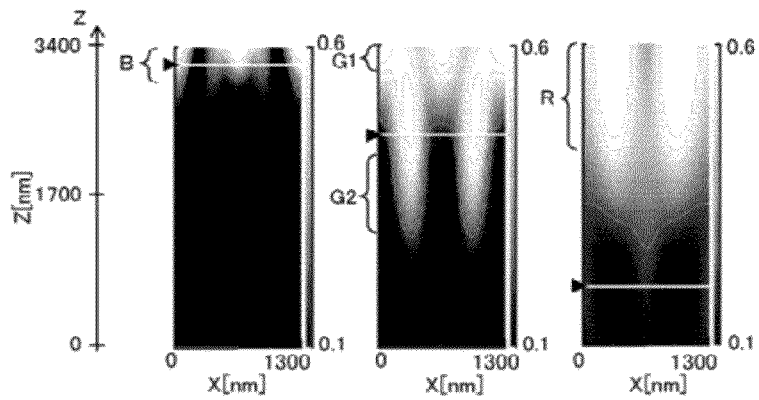

FIGS. 5A to 5P are diagrams of illustrating light intensity distributions of the red, green, and blue wavelengths in the image sensor of the present embodiment. FIGS. 5A to 5C illustrates the light intensity distributions which the light transmitting through the structure BL of the optical element forms on the sensing surface, which correspond to FIGS. 4E to 4G, respectively. FIGS. 5A to 5C are light intensity distributions of the blue, green, and red wavelengths, respectively. All of the light intensity distributions have a period of 1300 nm which is the same as the optical element. FIGS. 5A to 5C illustrate unit intensity periods, and a position where the light intensity is high is different with respect to each wavelength. When the light intensity is collected (localized) at the different position with respect to each wavelength, it is preferred that a mutual interaction with polarization be used with a shape including a straight line such as an L shape as the structure illustrated in FIG. 4D. In this case, it is preferred that the direction of the straight line is vertical to a periodic direction that has the optical element. The L shape is a kind of a concave shape, which is not a convex shape. The convex shape means a shape in which a line segment including arbitrary two points included inside the shape is always included inside the shape, which does not have a dent. The concave shape is a shape in which a line segment including arbitrary two points included in the shape is not necessarily included inside the shape, which has a dent. When the optical element has a refractive index pattern of the concave shape, the effect of collecting the intensity at the different position for each wavelength may be heightened. FIGS. 5E to 5G illustrate results of extracting the position where the intensity for each wavelength is high. The region where the sensing is not performed is indicated by a black color (0.0). FIGS. 5E to 5G illustrate regions where the blue, green, and red colors are sensed, respectively. The sensing regions of the blue, green, and red colors are not overlapped. FIG. 5D is the sensing regions of the blue, green, and red colors of the unit period. A dotted portion indicates the blue sensing region, the shaded portion indicates the green sensing region, and the black portion indicates the red sensing region.

The sensed lights in this region are 50% for the blue, 52% for the green, and 41% for the red with respect to amounts of the transmitted lights of FIGS. 5A to 5C. Using the common Bayer array, the lights are 25% for the blue, 50% for the green, and 25% for the red even when the transmittance of the color filter is ideally 100%. Therefore, when the color separation is performed using the optical element of the present embodiment, high light use efficiency is obtained. The effect of the color separation can be further improved by using the color filter that corresponds to the sensing region illustrated in FIG. 5D. The sensing efficiencies of the blue, green, and red colors can be adjusted by adjusting the area of the sensing region that corresponds to each wavelength illustrated in FIG. 5D.

FIGS. 5H to 5J are diagrams of comparing a structure that is not provided with a void in the second layer (a structure that does not have a refractive index pattern) with the optical element of the present embodiment. The light intensity obtained when the structure that does not have the refractive index pattern is a light intensity that is obtained by transmitting through the glass having the thickness of 1200 nm and the antireflection film having the same structure and then reaching the sensing surface of the same Si. FIGS. 5H to 5J compare this light intensity distribution with the light intensity distributions of FIGS. 5A to 5C that are obtained by transmitting through the optical element of the present embodiment, respectively. FIG. 5H is a light intensity distribution of the blue wavelength at y=L/2 (at a center), FIG. 5I is a light intensity distribution of the green wavelength at y=L/4, and FIG. 5J is a light intensity distribution of the red wavelength at y=L/4. In each drawing, the light intensity distribution obtained by the structure that does not have the refractive index pattern is illustrated in a uniform distribution in the x direction. A white region indicates a sensed region, and a gray region indicates a region that is used for sensing lights having other colors. The sensed light intensity obtained by using the optical element is higher than that obtained by using the structure that does not have the refractive index pattern.

Thus, according to the present embodiment, high sensitivity can be achieved. The sensitivity can be further improved by using a microlens as well. In the present embodiment, the same sensing surface is used for the blue, green, and red colors, but the sensing may also be performed at a different depth for each wavelength. The image sensor of the present embodiment achieves the high efficiency and the high sensitivity. Furthermore, since the lights of all the red, green, and blue wavelengths are sensed at one period of 1300 nm, the generation of the false color can be suppressed.

FIGS. 5K to 5M are light intensity distributions of the blue, green, and red lights respectively obtained when the light beam enters the optical element obliquely (5 degrees in the x direction). Due to the influence of the oblique incidence, the light intensity distributions are shifted in the x direction, but a position relation of collecting the intensity for each color is maintained. Therefore, the optical element can also be designed considering the oblique incidence characteristics. FIGS. 5N to 5P are light intensity distributions or the blue, green, and red lights, respectively, on the silicon Si. In the drawings, a vertical direction is the depth direction (the Z[nm] direction), a lateral direction is the x[nm], and a range of the unit period of 1300 nm is illustrated. FIG. 5N is a cross section of y=L/2 (center), and FIGS. 5O and 5P are a cross section of y=L/4. FIGS. 5N to 5P illustrate slice levels of the intensity values of 0.7, 0.6, 0.4, and 0.2. For comparison, a depth where the intensity value obtained when the light transmits through the glass substrate having a thickness of 1200 nm and further transmits through the antireflection film AR, which is a structure that does not have a refractive index pattern, is indicated by an arrow.

In a common image sensor, in view of the efficiency of the sensing, it is preferred that the blue light be deeply penetrated into the silicon Si and much of the red light be absorbed at shallower positions of the silicon Si. As illustrated in FIG. 5N, the blue light is deeply penetrated in the silicon Si at positions where the intensity is collected (the localized position). On the other hand, as illustrated in FIG. 5P, much of the red light is penetrated at the shallower positions of the silicon Si. According to the image sensor of the present embodiment, the efficiencies of sensing the blue light and the red light in a range of the same depth can be improved.

In FIGS. 5N to 5P, the regions in the z direction where the blue, green, and red lights are sensed at the position illustrated in FIG. 5D are indicated by B, G1, and R, respectively. This region is a region where the light having the intensity value greater than or equal to 1.0 is absorbed in the silicon Si up to the intensity value smaller than or equal to 0.7. For all of the blue, green, and red lights, it is a range greater than or equal to 100 nm in a depth direction. In FIG. 5O, the position of the green light where the intensity is collected due to the difference of the depth changes in the x direction. For example, in the depth region indicated by G2 in FIG. 5O, the green light may be sensed in the black region of FIG. 5D. The black region in FIG. 5D is a region where the red color is sensed at the depth indicated by R of FIG. 5P. Thus, at the different positions in the depth direction, the xy region where the blue, green, and red lights are sensed may also be arranged so as to be a different color. Furthermore, at the different positions in the depth direction, the xy region where the blue, green, and red lights are sensed may also be separated into different regions.

In the present embodiment, the structure BL1 has a role as a protective layer of the structure BL2 having the refractive index pattern. The thickness of the structure BL1 is not limited to 400 nm, and the optical element has a function similar to the present embodiment even when the structure BL1 has a thickness greater than 400 nm. Even if there is no layer constituting the structure BL1, the optical element has a function similar to the present embodiment.

Embodiment 3

Next, in Embodiment 3, a case in which an optical element that controls light intensity distributions of red (660 nm), green (550 nm), and blue (440 nm) wavelengths is applied to an image sensor (a solid-state image sensor) will be described. The light intensity distribution in the present embodiment is a light intensity distribution on the sensing surface of Embodiment 1.

The optical element of the present embodiment has a three-layer structure as illustrated in FIG. 3B, which contains a first layer configured by a glass having a thickness of 400 nm, a second layer configured by a glass having a thickness of 400 nm, provided with voids, and a third layer configured by a glass having a thickness of 400 nm. In the present embodiment, since the layer having the refractive index pattern is only the glass of the second layer, the alignment of each layer is easily performed. The structure of the second layer is the structure illustrated in FIG. 4K, which is different from the structure in Embodiment 2. In FIG. 4K, the white portion indicates a glass, and the black portion indicates a void (air). Both the length of height and width of the unit structure are 1300 nm. The detailed diagram is illustrated in FIG. 4P.

FIGS. 4L to 4N illustrate the light intensity distributions of the blue, green, and red wavelengths, respectively. As described above, in all the three light intensity distributions, the values of the intensities are high at the center portion of the unit structure. When the lights of the blue, green, and red wave lengths are sensed, it is preferred that the sensing be performed at the center portion of the unit structure. In the sensing structure where a wiring or a frame is disposed at the periphery of the unit structure and a light receiving portion is disposed at the center portion of the unit structure, the sensing can be performed efficiently. In the fine period such as a period of 1300 nm, the light intensity distribution can be efficiently collected at the center portion.

Figures 6A, 6B, 6C:
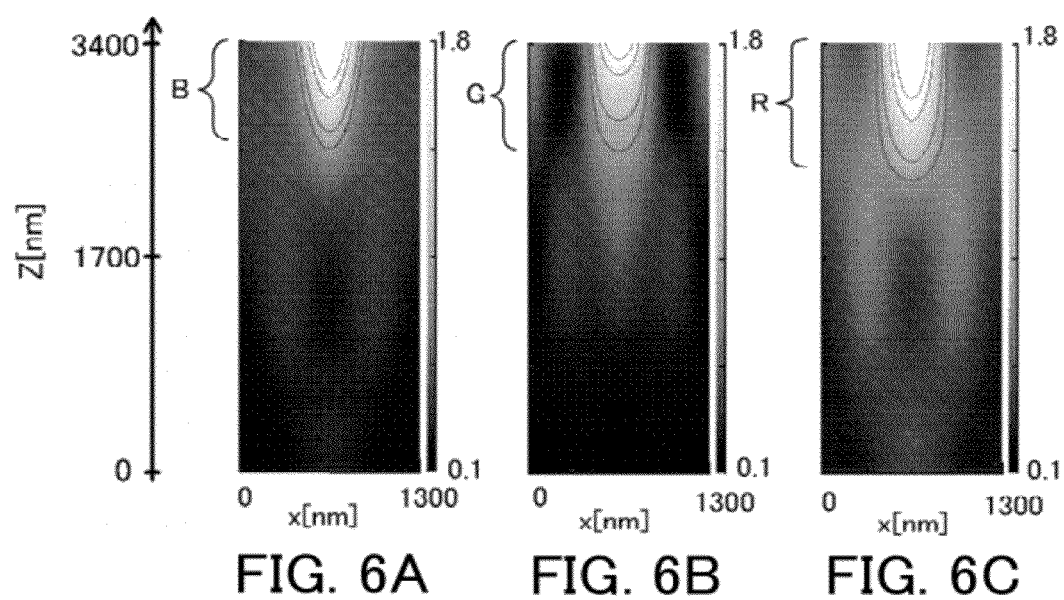
FIGS. 6A to 6C are diagrams of illustrating light intensity distributions inside silicon in an image pickup apparatus in Embodiment 3.

FIGS. 6A to 6C are diagrams of illustrating the light intensity distributions inside the silicon for the blue, green, and red lights, respectively, in the image pickup apparatus of the present embodiment. The vertical direction in FIGS. 6A to 6C indicates a depth direction (a z[nm] direction), the lateral direction indicates an x[nm] direction, and FIGS. 6A to 6C illustrate the range of the unit period of 1300 nm. All of FIGS. 6A to 6C are a cross section of y=L/2 (center). In FIGS. 6A to 6C, the slice levels of the intensity values 1.8, 1.5, 1.0, and 0.8 are illustrated. When the light transmitting through a glass substrate having a thickness of 1200 nm transmits through the antireflection film AR on condition that a refractive index pattern does not exist, the intensity value that reaches the silicon Si is 0.43 for the blue light, 0.49 for the green light, and 0.53 for the red light. In the present embodiment, the light intensity is collected at the center portion so as to avoid the frame or the wiring using the refractive index pattern of FIG. 4K to achieve the intensity value higher than that of the case where the refractive index pattern does not exist. In other words, the light can transmit the inside of the silicon (the center portion of the unit grating) even when the intensity of the light becomes lower, and therefore the high sensitivity can be achieved.

It is preferred that a common image sensor absorb the blue, green, and red lights at the same depth in the silicon in view of the efficiency of the sensing. The range indicated by B in FIG. 6A, the range indicated by G in FIG. 6B, and the range indicated by R in FIG. 6C are regions in which the light intensities of 0.8 to 1.8 for the blue, green, and red lights, respectively, are absorbed. Since the ranges of B, G, and R are substantially the same range in the silicon, the blue, green, and red lights are absorbed at substantially the same depth in the silicon. In addition, the light intensities of the blue, green, and red lights are collected at the center portion in a range more than 800 nm in the depth direction.

In the present embodiment, it is preferred that the color separation of the red, green, and blue colors be performed using a color filter. Since a pixel structure of the silicon is not separated for each color, the image sensor of the present embodiment is obtained by using a simple pixel structure compared to Embodiment 2.

Embodiment 4

Next, in Embodiment 4, a structure (an optical element) that has only a period in an x direction and that includes a metal will be described. The structure of the present embodiment has a uniform structure in a y direction. FIGS. 7A to 7D are diagrams of illustrating light intensity distributions of red, green, and blue wavelengths. In FIG. 7A, the lateral direction is an x direction, the vertical direction is a z direction, and a direction perpendicular to the paper is a y direction. The period of the structure is Lx=1300 nm. Diffracted lights have the highest diffraction orders of first, second, and third orders different from each other with respect to the red (652 nm), green (550 nm), and blue (430 nm) wavelengths, respectively.

FIG. 7A is a structure (a unit period) that is provided with a void Vac in a glass SiO2, which is provided with an antireflection film AR under the structure. FIG. 7C illustrates a light intensity distribution on an upper surface of a silicon Si when white light (polarization is in the y direction) vertically enters this structure. Reference symbols R, G, and B correspond to the red (652 nm), green (550 nm), and blue (430 nm) wavelengths, respectively.

FIG. 7B is a structure that is obtained by adding copper Cu that is a metal to the structure of FIG. 7A. FIG. 7D is a light intensity distribution on the upper surface of the silicon Si in the structure of FIG. 7B. Other than the addition of the structure of the copper, the incident white light and the structure of the antireflection film are the same as FIG. 7A. In FIG. 7D, the light intensity of the red, green, and blue wavelengths are collected at different positions for each wavelength, compared to FIG. 7C. Thus, also in the structure having the period only in the x direction, the light intensity can be controlled for each wavelength. Furthermore, the shape or the size of a refractive index pattern formed by a metal medium may also be adjusted to use a resonance phenomenon to control the light intensity distribution.

In the shape of the refractive index pattern in each embodiment described above (the embodiments in which the light intensity is collected at a different position for each wavelength, except Embodiment 3), it is preferred that a straight line shape having a length more than ($\frac{1}{4}n$) times as long as the center wavelength of the first wavelength region with respect to the maximum refractive index n of the refractive index pattern. It is because the mutual interaction between the interface of the refractive index patterns and the polarization of the incident light is strongly generated due to the inclusion of the straight line shape and a function that collects the light intensity may be obtained.

In the shape of the refractive index pattern in each embodiment described above (the embodiments in which the light intensity is collected at a different position for each wavelength, except Embodiment 3), the optical element is an element that emits a visible light beam and that has a period of 800 nm to 2500 nm in the x direction and the y direction orthogonal to the x direction. The plurality of media that have refractive indices different from each other are configured by including the glass and the void. In addition, the refractive index pattern is a rotationally symmetrical by 90 degrees on the xy plane, and includes the circular-shaped and the L-shaped voids on the xy plane, and it is preferred that the thickness of the void is 100 nm to 1 μm.

According to each embodiment described above, an optical element and an image sensor each having a different function for each wavelength and having a common structure for a plurality of wavelengths can be provided. The optical element of each embodiment is an element that controls the intensity distribution of the plurality of wavelengths in addition to a propagation direction of the plurality of wavelengths. Therefore, for example, the efficiency can be improved and also the false color can be suppressed in sensing the electromagnetic wave. When the light intensity distribution is controlled by the optical element of each embodiment described above, the phase or the polarization is also controlled at the same time. Therefore, the optical element may also control the phase or the polarization, as well as the light intensity distribution.

The optical element and the image sensor including the optical element of each embodiment described above can be applied to various kinds of apparatuses such as a digital video camera, a digital still camera, a cell phone with a camera, a broadcasting device, a digital microscope, a measurement device, a robot eye, a sensor of terahertz electromagnetic waves. They can also be applied to a solar battery, a display, an antenna, or a laser.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-081367, filed on Apr. 1, 2011, which is hereby incorporated by reference herein in its entirety.

What is claimed is:

1. An optical element comprising:
a refractive index pattern that is periodically formed by a plurality of media having refractive indices different from each other,
wherein the highest diffraction orders for at least three light beams of wavelength regions that enter the optical element are different from each other, and
wherein the light beams of the wavelength regions are emitted so that each of the light beams of the wavelength regions is periodically localized.

2. The optical element according to claim 1,
wherein the light beams of the wavelength regions are localized at positions different from each other.

3. The optical element according to claim 1,
wherein the light beams of the wavelength regions are localized at the same position.

4. An optical element comprising:
a refractive index pattern that is periodically formed by a plurality of media having refractive indices different from each other,
wherein the highest diffraction order for a light beam of a first wavelength region that enters the optical element is greater than the highest diffraction order for a light beam of a second wavelength region that is longer than the first wavelength region,
wherein the light beams of the first wavelength region and the second wavelength region are emitted so that each of the light beams of the first wavelength region and the second wavelength region is periodically localized, and
wherein the refractive index pattern includes a refractive index pattern smaller than a center wavelength of the second wavelength region.

5. The optical element according to claim 1,
wherein the refractive index pattern includes a plurality of refractive index patterns in a unit period of the refractive index pattern, and
wherein the plurality of refractive index patterns are at least one of different-sized patterns and non-similar patterns.

6. The optical element according to claim 1,
wherein the refractive index pattern includes a concave shape.

7. An optical element comprising:
a refractive index pattern that is periodically formed by a plurality of media having refractive indices different from each other,
wherein the highest diffraction order for a light beam of a first wavelength region that enters the optical element is greater than the highest diffraction order for a light beam of a second wavelength region that is longer than the first wavelength region,
wherein the light beams of the first wavelength region and the second wavelength region are emitted so that each of the light beams of the first wavelength region and the second wavelength region is periodically localized, and
wherein the refractive index pattern includes a straight line shape having at least ($\frac{1}{4}n$) times as long as a center wavelength of the first wavelength region for the maximum refractive index n of the refractive index pattern.

8. An optical element comprising:
a refractive index pattern that is periodically formed by a plurality of media having refractive indices different from each other,
wherein the highest diffraction order for a light beam of a first wavelength region that enters the optical element is greater than the highest diffraction order for a light beam of a second wavelength region that is longer than the first wavelength region,
wherein the light beams of the first wavelength region and the second wavelength region are emitted so that each of the light beams of the first wavelength region and the second wavelength region is periodically localized, wherein the optical element is an element that emits a visible light beam and that has a period of 800 nm to 2500 nm in an x direction and a y direction orthogonal to the x direction, wherein the plurality of media having the refractive indices different from each other are configured by including a glass and a void, wherein the refractive index pattern is rotationally symmetrical by 90 degrees on an xy plane and includes the void having a circular shape and an L shape on the xy plane, and wherein a thickness of the void is 100 nm to 1 μm.

9. An image sensor comprising:

an optical element including a refractive index pattern that is periodically formed by a plurality of media having refractive indices different from each other, wherein the highest diffraction orders for at least three light beams of wavelength regions that enter the optical element are different from each other, and wherein the light beams of the wavelength regions are emitted so that each of the light beams of the wavelength regions is periodically localized; and a light receiving element that has light receiving regions that the light beams of the wavelength regions enter are periodically disposed.

\* \* \* \* \*